(12) United States Patent
Lee et al.

(10) Patent No.: US 11,171,264 B2
(45) Date of Patent: Nov. 9, 2021

(54) LIGHT EMITTING MODULE

(71) Applicant: Seoul Semiconductor Co., Ltd., Ansan-si (KR)

(72) Inventors: Jong Min Lee, Ansan-si (KR); Bang Hyun Kim, Ansan-si (KR); Jae Ho Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/498,818

(22) PCT Filed: Mar. 19, 2018

(86) PCT No.: PCT/KR2018/003175
§ 371 (c)(1),
(2) Date: Sep. 27, 2019

(87) PCT Pub. No.: WO2018/182215
PCT Pub. Date: Oct. 4, 2018

(65) Prior Publication Data
US 2020/0066944 A1 Feb. 27, 2020

(30) Foreign Application Priority Data
Mar. 27, 2017 (KR) .......................... 10-2017-0038322

(51) Int. Cl.
*H01L 33/50* (2010.01)
*H01L 25/075* (2006.01)
(Continued)

(52) U.S. Cl.
CPC ........ *H01L 33/504* (2013.01); *H01L 25/0753* (2013.01); *H01L 33/483* (2013.01); *H01L 33/60* (2013.01)

(58) Field of Classification Search
None
See application file for complete search history.

(56) References Cited

U.S. PATENT DOCUMENTS 9,541,238 B2   1/2017   Hong et al.
9,786,827 B2   10/2017  Jung et al.
(Continued)

FOREIGN PATENT DOCUMENTS

JP   2009-135485   6/2009
JP   2009-212508   9/2009
(Continued)

OTHER PUBLICATIONS

International Search Report dated Jun. 22, 2018, in International Application No. PCT/KR2018/003175 (with English Translation).
(Continued)

*Primary Examiner* — Khaja Ahmad
(74) *Attorney, Agent, or Firm* — H.C. Park & Associates, PLC

(57) ABSTRACT

A light emitting module including a base substrate, a first light emitting diode disposed on the base substrate, and a second light emitting diode disposed on the base substrate and spaced apart from the first light emitting diode, in which each of the first light emitting diode and the second light emitting diode includes a first light emitting region and a second light emitting region, the second light emitting region being spaced apart from the first light emitting region and surrounding the first light emitting region.

20 Claims, 6 Drawing Sheets

(51) Int. Cl.
*H01L 33/48* (2010.01)
*H01L 33/60* (2010.01)

(56) References Cited

U.S. PATENT DOCUMENTS

| | | | | |
|---|---|---|---|---|
| 2002/0167477 | A1* | 11/2002 | Tsutsui | G09G 3/3648 345/89 |
| 2008/0186273 | A1* | 8/2008 | Krijn | G02F 1/133609 345/102 |
| 2010/0065861 | A1* | 3/2010 | Nagai | H01L 25/0753 257/88 |
| 2010/0202129 | A1* | 8/2010 | Abu-Ageel | G02B 19/0066 362/84 |
| 2010/0309648 | A1* | 12/2010 | Willemsen | H01L 27/15 362/84 |
| 2011/0032724 | A1* | 2/2011 | Kinoshita | G02B 27/0994 362/552 |
| 2012/0146058 | A1* | 6/2012 | Tsang | H05B 45/22 257/84 |
| 2014/0239325 | A1* | 8/2014 | Andrews | H01L 25/0753 257/98 |
| 2015/0228629 | A1* | 8/2015 | Tsai | H01L 33/507 257/89 |
| 2016/0153622 | A1* | 6/2016 | Yu | F21V 29/70 362/231 |
| 2016/0258603 | A1* | 9/2016 | Yokotani | F21V 19/02 |

FOREIGN PATENT DOCUMENTS

| | | |
|---|---|---|
| KR | 10-2011-0002907 | 1/2011 |
| KR | 10-2012-0064838 | 6/2012 |
| KR | 10-2015-0007854 | 1/2015 |
| WO | 2016/062834 | 6/2016 |

OTHER PUBLICATIONS

Office Action dated Mar. 22, 2021 from the Korean Patent Office for Korean Patent Application No. 10-2017-0038322.
Office Action dated Sep. 7, 2021, from the Korean Patent Office for Korean Patent Application No. 10-2017-0038322 (with English Translation).

* cited by examiner

LIGHT EMITTING MODULE

CROSS-REFERENCE TO RELATED APPLICATIONS

This application is a National Stage Entry of International Application No. PCT/KR2018/003175, filed on Mar. 19, 2018, and claims priority from and the benefit of Korean Patent Application No. 10-2017-0038322, filed on Mar. 27, 2017, each of which are hereby incorporated by reference for all purposes as set forth herein.

BACKGROUND

Field

Exemplary embodiments of the present invention relate to a light emitting module and, more particularly, to a light emitting module including a plurality of light emitting diodes.

Discussion of the Background

A typical light emitting module includes a light emitting part, in which a single wavelength conversion layer is formed on a single light emitting diode (LED) chip, and a lens disposed on the light emitting part. However, it is generally difficult to regulate beam angle and color temperature (CCT) of a typical light emitting module.

In addition, since a typical light emitting module emits light in a single mode having a wide beam angle or a narrow beam angle, it is difficult for a single light emitting module to simultaneously realize both a wide beam angle and a narrow beam angle.

Accordingly, a mobile device including a wide angle camera and a narrow angle camera does not provide illumination for the wide angle camera and the narrow angle camera using a single camera flash.

The above information disclosed in this Background section is only for understanding of the background of the inventive concepts, and, therefore, it may contain information that does not constitute prior art.

SUMMARY

Light emitting modules constructed according to exemplary embodiments of the invention are capable of adjusting beam angle of light emitted therefrom.

Exemplary embodiments also provide a light emitting module capable of emitting light having both a relatively wide beam angle and a relatively narrow beam angle, and capable of adjusting color temperature.

Additional features of the inventive concepts will be set forth in the description which follows, and in part will be apparent from the description, or may be learned by practice of the inventive concepts A light emitting module according to an exemplary embodiment includes a base substrate, a first light emitting diode disposed on the base substrate, and a second light emitting diode disposed on the base substrate and spaced apart from the first light emitting diode, in which each of the first light emitting diode and the second light emitting diode includes a first light emitting region and a second light emitting region, the second light emitting region being spaced apart from the first light emitting region and surrounding the first light emitting region.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
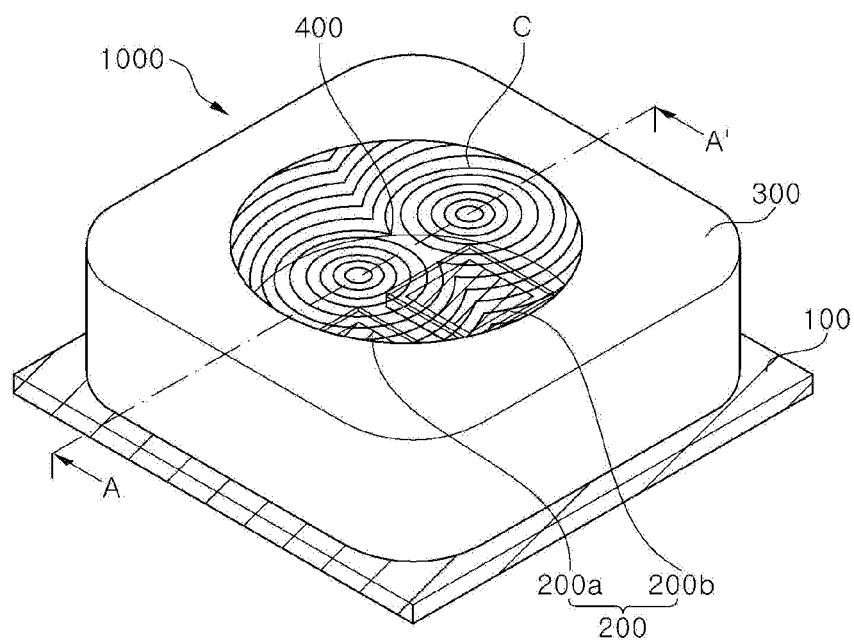
FIG. 1A is a perspective view of a light emitting module according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting module according to an exemplary embodiment includes a base substrate, a first light emitting diode disposed on the base substrate, and a second light emitting diode disposed on the base substrate and spaced apart from the first light emitting diode, in which each of the first light emitting diode and the second light emitting diode includes a first light emitting region and a second light emitting region, the second light emitting region being spaced apart from the first light emitting region and surrounding the first light emitting region.

Each of the first and second light emitting diodes may be configured to be independently operated. More particularly, the base substrate may include an electrode pattern and each of the first and second light emitting diodes may be connected to the electrode pattern to be independently operated.

Each of the first and second light emitting regions included in each of the first and second light emitting diodes may include a first conductivity type semiconductor layer, an active, layer and a second conductivity type semiconductor layer. Here, the first and second light emitting regions may also be independently operated. The first and second light emitting regions may share the same center, thereby allowing variation (control) of the beam angle of the first and second light emitting diodes.

Each of the first and second light emitting diodes may control a beam angle of light emitted therefrom through control of a ratio of power applied to the first and second light emitting regions.

The beam angles of light emitted from the first and second light emitting diodes may be controlled to be the same or different.

Each of the first and second light emitting diodes may further include a wavelength conversion layer covering the first and second light emitting regions.

The wavelength conversion layer may include the same phosphor in the first and second light emitting regions. Alternatively, the wavelength conversion layer may include a first conversion layer corresponding to the first light emitting region and including a first phosphor, and a second wavelength conversion layer corresponding to the second light emitting region and including a second phosphor. The wavelength conversion layer may further include a barrier layer interposed between the first wavelength conversion layer and the second wavelength conversion layer. The barrier layer may promote spreading of light.

Each of the first and second light emitting diodes may control a color temperature of light emitted therefrom through control of a ratio of power applied to the first and second light emitting regions.

Each of the first and second light emitting diodes may simultaneously control a color temperature and a beam angle of light emitted therefrom through control of a ratio of power applied to the first and second light emitting regions.

The color temperature of the light emitted from the first light emitting diode may be the same as or different from that of the light emitted from the second light emitting diode.

The light emitting module may further include a lateral reflective layer covering a side surface of the second light emitting region. The lateral reflective layer may cover the side surface of the second light emitting region in each of the first and second light emitting diodes, thereby blocking light emitted through the side surface thereof. The lateral reflective layer may control the beam angle of light emitted from each of the light emitting diodes in a certain range.

The light emitting module may further include a lens disposed on the first and second light emitting diodes, which may have two foci. The two foci of the lens may correspond to optical axes of the first and second light emitting diodes, respectively.

The light emitting module may further include a housing disposed on the base substrate and including a cavity, in which the first and second light emitting diodes may be disposed in the cavity. The housing may protect the first and second light emitting diodes and may serve to secure the lens.

Figure 1B:
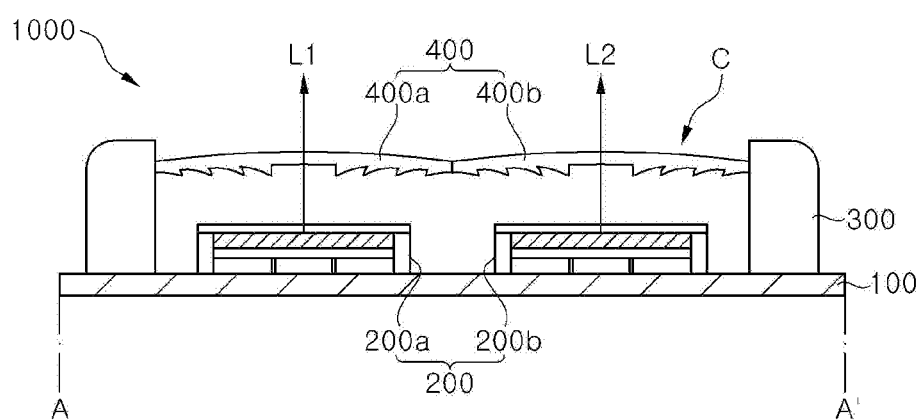
FIG. 1B is a cross-sectional view taken along line A-A' of FIG. 1A.

FIG. 1 shows a light emitting module 1000 according to an exemplary embodiment of the present invention. More particularly, FIG. 1A is a perspective view of the light emitting module 1000, and FIG. 1B is a cross-sectional view taken along line A-A' of FIG. 1A.

Referring to FIGS. 1A and 1B, the light emitting module 1000 may include a base substrate 100, a first light emitting diode 200a, a second light emitting diode 200b, a housing 300, and a lens 400.

The base substrate 100 may include an insulating substrate. The insulating substrate may be a ceramic substrate, and may include, for example, an AlN substrate. The AlN has good durability at high temperature and exhibits good heat dissipation. In some exemplary embodiments, the base substrate 100 may include an electrode pattern.

The first light emitting diode 200a and the second light emitting diode 200b may be disposed on the base substrate 100. The first light emitting diode 200a and the second light emitting diode 200b may be separated from each other by a predetermined distance, and may be electrically connected to electrode patterns of the base substrate 100 so as to be operated independently from each other.

Figure 2A:
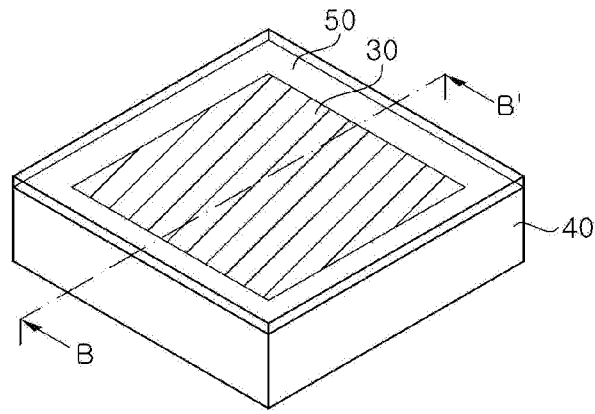
FIG. 2A is a perspective view of a light emitting diode in the light emitting module shown in FIG. 1.
Figure 2B:
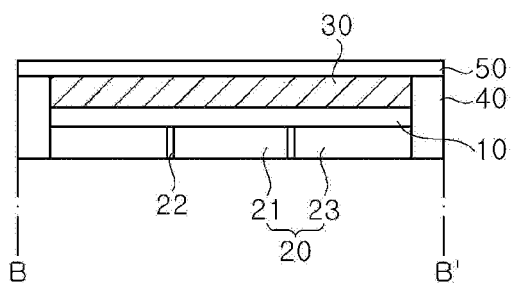
FIG. 2B is a cross-sectional view taken along line B-B' of FIG. 2A.

The first and second light emitting diodes 200a, 200b will be described in more detail with reference to FIGS. 2A and 2B. FIGS. 2A and 2B show the first and second light emitting diodes 200a, 200b in the light emitting module 1000 of FIG. 1, in which FIG. 2A is a perspective view of the light emitting diode and FIG. 2B is a cross-sectional view taken along line B-B' of FIG. 2A. The first and second light emitting diodes 200a, 200b may have substantially the same components and substantially the same structure. As such, the components and structure of the light emitting diode described in FIGS. 2A and 2B may be applied to each of the first and second light emitting diodes 200a, 200b.

Referring to FIGS. 2A and 2B, a light emitting diode may include a substrate 10, a light emitting structure 20 disposed on the substrate 10, and a wavelength conversion layer 30 covering the light emitting structure 20. The light emitting diode may further include a lateral reflective layer 40 surrounding a side surface of the light emitting structure 20, and a light spreading layer 50 covering an upper surface of the wavelength conversion layer 30.

The substrate 10 may be selected from any substrates capable of growth of a gallium nitride semiconductor layer thereon without limitation. For example, the substrate 10 may be selected from among a sapphire substrate, a silicon carbide substrate, a gallium nitride substrate, an aluminum nitride substrate, a silicon substrate, and the like. Further, the substrate 10 may be a transparent substrate allowing transmission of light therethrough, and may have a roughness pattern formed on an upper surface thereof.

The light emitting structure 20 may include a first conductivity type semiconductor layer, a second conductivity type semiconductor layer, and an active layer interposed between the first conductivity type semiconductor layer and the second conductivity type semiconductor layer. The first conductivity type semiconductor layer, the active layer, and the second conductivity type semiconductor layer may be sequentially stacked on the substrate 10.

The first conductivity type semiconductor layer may be a gallium nitride semiconductor layer doped with n-type impurities, for example, Si, and the second conductivity type semiconductor layer may be a gallium nitride semiconductor layer doped with p-type impurities, for example, Mg, or vice versa. The active layer may have a single quantum well structure or a multi-quantum well structure. The composition and thickness of the well layer in the active layer determine the wavelength of light generated therefrom. In particular, the active layer may be configured to emit UV light, blue light, or green light through adjustment of the composition of the well layers.

The light emitting structure 20 may include a plurality of light emitting regions. For example, referring to FIG. 2B, the light emitting structure 20 may include a first light emitting region 21 and a second light emitting region 23. The second light emitting region 23 may be spaced apart from the first light emitting region 21 while surrounding the first light emitting region 21. Each of the light emitting regions may be referred to as a light emitting cell. Although FIGS. 2A and 2B show only two light emitting regions, the inventive concepts are not limited thereto, and in some exemplary embodiments, the light emitting structure 20 may include three or more light emitting regions sharing the same center.

The first light emitting region 21 and the second light emitting region 23 may be defined by an isolation trench 22. The second light emitting region 23 may be separated from the first light emitting region 21 by the isolation trench 22. The isolation trench 22 may expose a portion of the first conductivity type semiconductor layer through an upper surface of the light emitting structure 20, that is, through the second conductivity type semiconductor layer and the active layer. Alternatively, the isolation trench 22 may expose a portion of the substrate 10 through the second conductivity type semiconductor layer, the active layer, and the first conductivity type semiconductor layer.

The isolation trench 22 may have a circular or rectangular closed-loop structure in an inner region on the upper surface of the light emitting structure 20. The first light emitting region 21 may be disposed inside the isolation trench 22 having the closed-loop structure, and the second light emitting region 23 may be disposed outside the isolation trench 22.

According to other exemplary embodiments, the second light emitting region 23 may be formed by etching the light emitting structure 20, and the first light emitting region 21 may be separately formed and coupled to the second light emitting region 23, or vice versa. For example, in order to define a region to which the first light emitting region 21 will be coupled, the inner region of the isolation trench 22 having the closed-loop structure may be removed by etching, and the first light emitting region 21 may be coupled to the inner region of the isolation trench that has been removed by etching, thereby forming the light emitting structure 20 including a plurality of light emitting regions. Here, the first light emitting region 21 may be flush with the second light emitting region 23.

Alternatively, the first light emitting region 21 may be formed by etching the light emitting structure 20, and the second light emitting region 23 may be separately formed and coupled to the first light emitting region 21.

In the light emitting structure 20 formed by such a manufacturing method, the first light emitting region 21 and the second light emitting region 23 may emit light having the same or different wavelength bands. More particularly, the active layer of the first light emitting region 21 may have a different composition from the active layer of the second light emitting region 23, whereby the first and second light emitting regions may emit light having different wavelengths.

The shapes of the first and second light emitting regions 21, 23 may be determined depending upon the shape of the isolation trench 22. For example, for the isolation trench 22 having a rectangular closed-loop structure, the first light emitting region 21 disposed inside the closed-loop structure has a rectangular shape and the second light emitting region 23 surrounds the first light emitting region to be separated therefrom by the isolation trench 22 as a boundary therebetween.

Referring to FIG. 2B, the first light emitting region 21 may be disposed at the center of the light emitting structure 20. The isolation trench 22 may be disposed along the outer periphery of the first light emitting region 21, and the second light emitting region 23 may be separated from the first light emitting region 21 by the isolation trench 22 while surrounding the first light emitting region 21. In addition, an insulation layer may be disposed in the isolation trench 22. The insulation layer may block unintentional electrical connection between the first light emitting region 21 and the second light emitting region 23. The insulation layer improves reliability during independent operation of the first light emitting region 21 and the second light emitting region 23 of the light emitting diode.

The light emitting regions in the light emitting structure 20, that is, the first light emitting region 21 and the second light emitting region 23, may be independently operated. That is, the first light emitting region 21 and the second light emitting region 23 may output the same or different power in response to the same or different magnitudes of current and/or voltage.

For example, when higher magnitudes of voltage and/or current are supplied to the first light emitting region 21 than to the second light emitting region 23, the first light emitting region 21 disposed at the center of the light emitting structure 20 may output higher power than the second light emitting region 23, and thus, light emitted from the light emitting diode can have a relatively narrow beam angle.

As another example, when higher magnitudes of voltage and/or current are supplied to the second light emitting region 23 than to the first light emitting region 21, the second light emitting region 23 disposed along the outer periphery of the light emitting structure 20 may output higher power than the first light emitting region 21, and thus, light emitted from the light emitting diode can have a relatively wide beam angle.

That is, the light emitting diode according to an exemplary embodiment the present invention has a structure, in which the second light emitting region 23 surrounds the first light emitting region 21, thereby allowing variation of the beam angle of light emitted therefrom through adjustment of the magnitude of voltage and/or current supplied to the first light emitting region 21 and the second light emitting region 23.

As such, in order to allow independent operation of each of the first light emitting region 21 and the second light emitting region 23, the light emitting diode may include a first pair of electrodes electrically connected to the first conductivity type semiconductor layer and the second conductivity type semiconductor layer in the first light emitting region 21, and a second pair of electrodes electrically connected to the first conductivity type semiconductor layer and the second conductivity type semiconductor layer in the second light emitting region 23. In this manner, the first light emitting region 21 may be operated independently from the second light emitting region 23 by receiving voltage and/or current through the first pair of electrodes, and the second light emitting region 23 may be operated independently from the first light emitting region 21 by receiving voltage and/or current through the second pair of electrodes.

Alternatively, in order to allow independent operation of each of the first light emitting region 21 and the second light emitting region 23, the light emitting diode may include a common electrode electrically connected to both the first light emitting region 21 and the second light emitting region 23.

For example, the common electrode may be commonly connected to the first conductivity type semiconductor layer (or the second conductivity type semiconductor layer) of the first light emitting region 21 and the first conductivity type semiconductor layer (or the second conductivity type semiconductor layer) of the second light emitting region 23. In this case, the light emitting diode may further include a first electrode electrically connected to the second conductivity type semiconductor layer (or the first conductivity type semiconductor layer) of the first light emitting region 21 and a second electrode electrically connected to the second conductivity type semiconductor layer (or the first conductivity type semiconductor layer) of the second light emitting region 23.

Still alternatively, the common electrode may be commonly connected to the first conductivity type semiconductor layer (or the second conductivity type semiconductor layer) of the first light emitting region 21 and the second conductivity type semiconductor layer (or the first conductivity type semiconductor layer) of the second light emitting region 23. In this case, the light emitting diode may further include a first electrode electrically connected to the second conductivity type semiconductor layer (or the first conductivity type semiconductor layer) of the first light emitting region 21 and a second electrode electrically connected to the first conductivity type semiconductor layer (or the second conductivity type semiconductor layer) of the second light emitting diode 200b.

The wavelength conversion layer 30 covers the upper surface of the light emitting structure 20. Here, the upper surface of the light emitting structure 20 may be a main light exit surface. Referring to FIG. 2B, the substrate 10 is disposed on the main light exit surface of the light emitting structure 20, that is, the upper surface thereof. In this case, the substrate 10 may be a transparent substrate and the wavelength conversion layer 30 may cover the substrate 10. In another exemplary embodiment, the substrate 10 may be disposed under the light emitting structure 20, more particularly, on a surface of the light emitting structure 20 opposing the main light exit surface. In addition, the wavelength conversion layer 30 may be disposed on the light emitting structure 20.

The wavelength conversion layer 30 may include phosphors, which convert the wavelength of light emitted from the light emitting diode chip. The wavelength conversion layer 30 has a predetermined thickness or more, in order to prevent the phosphors from being deformed and/or discolored through exposure.

The lateral reflective layer 40 may cover a side surface of the light emitting structure 20. The lateral reflective layer 40 may cover a side surface of the second light emitting region 23. In addition, the lateral reflective layer 40 may cover a side surface of the wavelength conversion layer 30 covering the upper surface of the light emitting structure 20. The lateral reflective layer 40 reflects light emitted through the side surface of the light emitting structure 20 to be directed toward the upper surface of the light emitting structure 20. The lateral reflective layer 40 may restrict the beam angle of light emitted from the light emitting diode.

The lateral reflective layer 40 may include a white wall formed of a resin material. The lateral reflective layer 40 including the white wall formed of the resin material may have a predetermined thickness or more in order to improve reliability in blocking or reflecting light traveling toward the side surface of the light emitting structure 20. This is because the lateral reflective layer 40 having a small thickness allows some fraction of light to pass therethrough. For example, the lateral reflective layer 40 may have a thickness of 50 μm or more.

Alternatively, the lateral reflective layer 40 may include a metal reflective layer of Ag or Al having high reflectivity. The lateral reflective layer 40 including the metal reflective layer can block and reflect light even with a thickness of several micrometers or less. For example, the lateral reflective layer 40 may be formed to a thickness of 5 μm or less, more specifically about 1 μm to 2 μm. In addition, unlike the lateral reflective layer 40 including the white wall formed of the resin material, the lateral reflective layer 40 including the metal reflective layer is formed of a metallic material, and thus, has a low risk of cracking.

The light spreading layer 50 may cover an upper surface of the wavelength conversion layer 30 disposed on the light emitting structure 20. The light spreading layer 50 may further extend in a horizontal direction to cover an upper surface of the lateral reflective layer 40. The light spreading layer 50 may assist in spreading of light emitted from the light emitting diode, and may determine the degree of light spreading through control of the concentration thereof.

Referring back to FIGS. 1A and 1B, the housing 300 may include a cavity C, which defines a region in which the light emitting diodes 200a, 200b are mounted. The cavity C may be disposed at the center of the light emitting module 1000. The cavity C is surrounded by a sidewall. The sidewall may be formed perpendicular to the base substrate 100. Alternatively, the sidewall may have an inclined facet to reflect light emitted from the light emitting diodes 200a, 200b. In addition, the cavity C may have a rotational symmetry, particularly a circular shape. As used herein, rotational symmetry does not only mean a rotating body, but also encompasses a structure, in which the same shape is maintained when rotated at a certain angle, such as 60 degrees, 90 degrees, 130 degrees, or 180 degrees. Here, the cavity C may have various shapes as needed, without being limited to a circular shape.

The lens 400 may be disposed on the light emitting diodes 200a, 200b. The lens 400 may be secured to the housing 300 to be disposed on the light emitting diodes. The lens 400 may include a Fresnel lens. Referring to FIGS. 1A and 1B, the lens 400 may include two foci. As described above, each of the first light emitting diode 200a and the second light emitting diode 200b has the structure, in which the second light emitting region 23 surrounds the first light emitting region 21. More particularly, since the first and second light emitting regions 21, 23 has the same center, each of the first and second light emitting diodes 200a, 200b can collect light through a single focus. Accordingly, the light emitting module 1000 may be realized through the lens 400 having two foci.

Referring to FIG. 1B, the two foci of the lens 400 may correspond to the first light emitting diode 200a and the second light emitting diode 200b, respectively. The two foci may be disposed to correspond to an optical axis L1 of the first light emitting diode 200a and an optical axis L2 of the second light emitting diode 200b.

According to the illustrated exemplary embodiment, the light emitting module 1000 includes the first light emitting diode 200a and the second light emitting diode 200b disposed on the base substrate 100 to be spaced apart from each other, and allowing control of the beam angle of light emitted therefrom. The beam angles of light emitted from the first light emitting diode 200a and the second light emitting diode 200b may be controlled to be the same or different.

Figure 3:
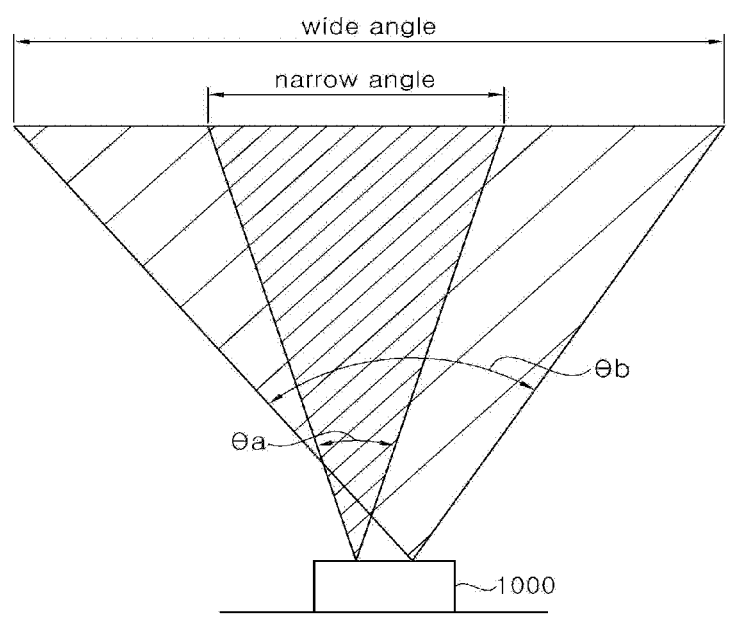
FIG. 3 is a view exemplarily illustrating beam angles of light emitted from the light emitting module according to an exemplary embodiment of the present invention.

FIG. 3 shows the beam angle of light emitted from the light emitting module 1000 according to an exemplary embodiment. Referring to FIG. 3, a beam angle $\theta_\alpha$ of the first light emitting diode 200a may be narrower than a beam angle $\theta_\beta$ of the second light emitting diode 200b. The beam angle $\theta\alpha$ of the first light emitting diode 200a may become narrower by increasing the ratio of power applied to the first light emitting region 21 over power applied to the second light emitting region 23. For example, a higher ratio of power applied to the first light emitting region 21 may cause a narrower beam angle $\theta_\alpha$ of the first light emitting diode 200a.

The beam angle $\theta_\beta$ of the second light emitting diode 200b may be wider than the beam angle $\theta_\alpha$ of the first light emitting diode 200a. The beam angle $\theta_\beta$ of the second light emitting diode 200b may become wider by increasing the ratio of power applied to the second light emitting region 23 over power applied to the first light emitting region 21. For example, a higher ratio of power applied to the second light emitting region 23 may cause a wider beam angle $\theta_\beta$ of the second light emitting diode 200b.

The beam angles $\theta_\alpha$, $\theta_\beta$ of the first light emitting diode 200a and the second light emitting diode 200b shown in FIG. 3 are merely exemplary, and the inventive concepts are not limited thereto. In some exemplary embodiments, the beam angle $\theta_\alpha$ of the first light emitting diode 200a may be the same as the beam angle $\theta_\beta$ of the second light emitting diode 200b, or the beam angle $\theta_\alpha$ of the first light emitting diode 200a may be wider than the beam angle $\theta_\beta$ of the second light emitting diode 200b.

When the beam angle $\theta_\alpha$ of the first light emitting diode 200a is different from the beam angle $\theta_\beta$ of the second light emitting diode 200b, the ratios of power applied to the first and second light emitting diodes 200a, 200b through the base substrate 100 may be controlled to be different. For example, the power applied to the second light emitting diode 200b emitting light at a relatively wide beam angle $\theta_\beta$ may be increased above the power applied to the first light emitting diode 200a.

In addition, the light emitting module 1000 according to the illustrated exemplary embodiment may realize white light having different color temperatures by changing the combination of phosphors included in the wavelength conversion layer 30 of the first light emitting diode 200a and in the wavelength conversion layer 30 of the second light emitting diode 200b.

For example, the wavelength conversion layer 30 of the first light emitting diode 200a may realize warm white light through conversion of the wavelength of light emitted from the first light emitting diode 200a. In addition, the wavelength conversion layer 30 of the second light emitting diode 200b may realize cool white light through conversion of the wavelength of light emitted from the second light emitting diode 200b. Alternatively, the wavelength conversion layers 30 of the first and second light emitting diodes 200a, 200b may be formed to realize cool white light and warm white light.

When the wavelength conversion layers 30 of the first and second light emitting diodes 200a, 200b have different combinations of phosphors, the color temperature of light emitted from the light emitting module 1000 may be adjusted by adjusting the power output from the first and second light emitting diodes 200a, 200b. For example, the warm white light from the first light emitting diode 200a may be mixed with the cool white light from the second light emitting diode 200b. In this case, the color temperature of light emitted from the light emitting module 1000 may be adjusted by setting the power of the first light emitting diode 200a to be different from the power of the second light emitting diode 200b.

For example, when the power of the first light emitting diode 200a is set to be higher than the power of the second light emitting diode 200b, light emitted from the light emitting module 1000 may have a color temperature approaching warm white light. Alternatively, when the power of the second light emitting diode 200b is set to be higher than the first light emitting diode 200a, the light emitted from the light emitting module 1000 may have a color temperature approaching cool white light.

The light emitting module 1000 according to the illustrated exemplary embodiment may be used in an apparatus that utilizes a wide beam angle and a narrow beam angle at the same time. In addition, the light emitting module 1000 according to the illustrated exemplary embodiment may be used in an apparatus that utilizes light having different color temperatures.

Figure 4:
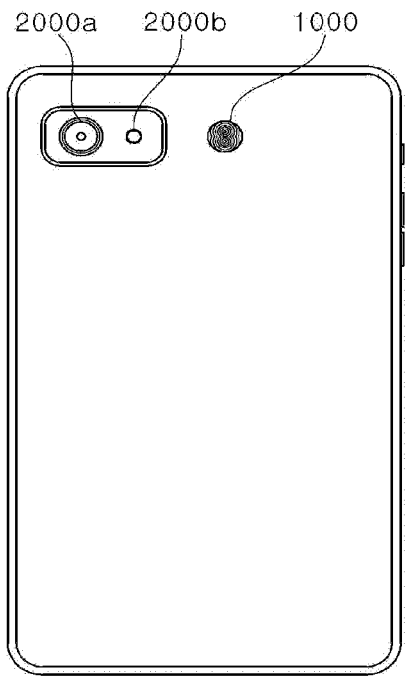
FIG. 4 is a view of a device including a light emitting module 1000 according to an exemplary embodiment.

FIG. 4 is a view of a device including the light emitting module 1000 according to an exemplary embodiment. Referring to FIG. 4, the device is a mobile device including a wide angle camera 2000a, a narrow angle camera 2000b, and a light emitting module 1000. Here, the light emitting module 1000 may be the light emitting module 1000 shown in FIGS. 1 to 3, and may be used as a flash lamp for the wide angle camera 2000a and the narrow angle camera 2000b.

More particularly, in the light emitting module 1000, the first light emitting diode 200a may emit light at a narrow beam angle $\theta\alpha$ by increasing the ratio of power applied to the first light emitting region 21. Accordingly, the first light emitting diode 200a may be used as a flash lamp for the narrow angle camera 2000a. In addition, the second light emitting diode 200b of the light emitting module 1000 may emit light at a wide beam angle $\theta_\beta$ by increasing the ratio of power applied to the second light emitting region 23. Accordingly, the second light emitting diode 200b may be used as a flash lamp for the wide angle camera 2000b.

In addition, the ratios of power applied to the first and second light emitting diodes 200a, 200b through the electrode pattern of the base substrate 100 may be controlled to be different. For example, as described above, when the beam angle $\theta_\beta$ of the second light emitting diode 200b is wider than the beam angle $\theta\alpha$ of the first light emitting diode 200a, the ratio of power applied to the second light emitting diode 200b may be controlled to be higher than the ratio of power applied to the first light emitting diode 200a.

Figure 5A:
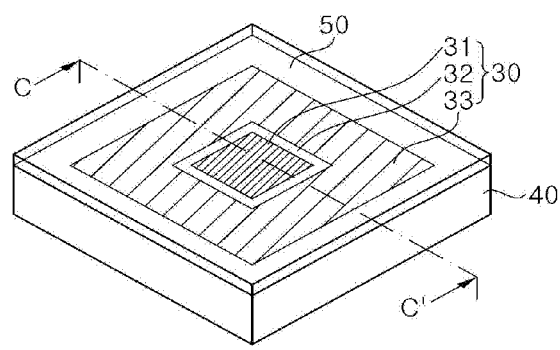
FIG. 5A is a perspective view of a light emitting diode according to another exemplary embodiment of the present invention.
Figure 5B:
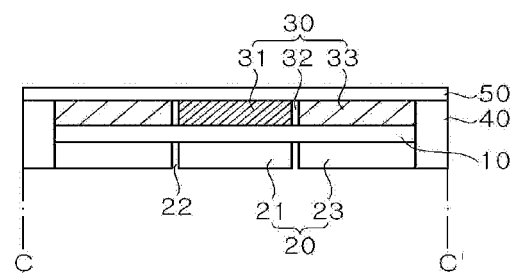
FIG. 5B is a cross-sectional view taken along line C-C' of FIG. 5A.

FIGS. 5A and 5B show a light emitting diode according to another exemplary embodiment. FIG. 5A is a perspective view of the light emitting diode according to another exemplary embodiment, and FIG. 5B is a cross-sectional view taken along line C-C' of FIG. 5A. Most components of the light emitting diode shown in FIGS. 5A and 5B are identical to those of the light emitting diode shown in FIGS. 2A and 2B, except for the shape of the wavelength conversion layer 30. The light emitting diode shown in FIGS. 5A and 5B may be at least one of the first light emitting diode 200a and the second light emitting diode 200b included in the light emitting module 1000 of FIG. 1. Hereinafter, the following description will be focused on different features of the light emitting diode illustrated in FIGS. 5A and 5B.

Referring to FIGS. 5A and 5B, the wavelength conversion layer 30 may include two regions corresponding to the structure of the light emitting structure 20 including the two light emitting regions. More particularly, the wavelength conversion layer 30 may include a first wavelength conversion layer 31 corresponding to the first light emitting region 21 and a second wavelength conversion layer 33 corresponding to the second light emitting region 23. Accordingly, as the structure of the light emitting regions, the wavelength conversion layer 30 has a structure, in which the first wavelength conversion layer 31 is disposed in a central region of the wavelength conversion layer 30 and the second wavelength conversion layer 33 surrounds the first wavelength conversion layer 30.

In addition, the wavelength conversion layer 30 may further include a barrier layer 32 interposed between the first wavelength conversion layer 31 and the second wavelength conversion layer 33. The barrier layer 32 may promote spreading of light, thereby promoting mixing of light emitted from the first wavelength conversion layer 31 and the second wavelength conversion layer 33 and having different wavelengths. The barrier layer 32 can minimize rapid occurrence of color deviation or light change at the border between the first wavelength conversion layer 31 and the second wavelength conversion layer 33. The barrier layer 32 may be formed of any material capable of promoting light spreading. The barrier layer 32 may be disposed on the isolation trench 22 in the light emitting structure 20.

The wavelength conversion layer 30 may be formed as a single sheet through screen printing and the like. For example, a sheet of the first wavelength conversion layer 31 may be prepared and partially removed to define a region for the second wavelength conversion layer 33. In addition, the second wavelength conversion layer 33 is formed in a region, from which a portion of the sheet of the first wavelength conversion layer 31 is removed, thereby providing a single sheet of the wavelength conversion layer 30.

Alternatively, a sheet of the second wavelength conversion layer 33 may be prepared and partially removed to define a region for the first wavelength conversion layer 31. In this case, the first wavelength conversion layer 31 is formed in a region, from which a portion of the second wavelength conversion layer 33 is removed, thereby providing a single sheet of the wavelength conversion layer 30.

The first wavelength conversion layer 31 may include a first phosphor and the second wavelength conversion layer 33 may include a second phosphor. Here, the first and second phosphors may be different. For example, the first phosphor of the first wavelength conversion layer 31 converts the wavelength of light emitted from the first light emitting region 21, thereby realizing warm white light having a color temperature of 2700K to 3500K. In addition, the second phosphor of the second wavelength conversion layer 33 converts the wavelength of light emitted from the second light emitting region 23, thereby realizing cool white light having a color temperature of 5000K to 6500K.

In some exemplary embodiments, the first phosphor of the first wavelength conversion layer 31 converts the wavelength of light emitted from the first light emitting region 21, thereby realizing cool white light having a color temperature of 5000K to 6500K. In addition, the second phosphor of the second wavelength conversion layer 33 converts the wavelength of light emitted from the second light emitting region 23, thereby realizing warm white light having a color temperature of 2700K to 3500K.

As described above, the first light emitting region 21 and the second light emitting region 23 may be independently operated, and thus, may output different magnitudes of power. For example, when light emitted from the first light emitting region 21 is combined with light emitted from the first wavelength conversion layer 31 to realize warm white light, and light emitted from the second light emitting region 23 is combined with light emitted from the second wavelength conversion layer 33 to realize cool white light (or vice versa), the color temperature or correlated color temperature (CTT) of light realized by the light emitting diode may be adjusted by adjusting the magnitudes of voltage and/or electric current input to the first light emitting region 21 and the second light emitting region 23.

For example, when the first light emitting region 21 is combined with the first wavelength conversion layer 31 to realize warm white light, and the second light emitting region 23 is combined with the second wavelength conversion layer 33 to realize cool white light, white light emitted from the light emitting diode may have a color temperature of 2700K to 3500K upon application of external power to the first light emitting region 21, without application of external power to the second light emitting region 23.

Alternatively, upon application of external power to the second light emitting region 23 without application of external power to the first light emitting region 21, white light emitted from the light emitting diode may have a color temperature of 5000K to 6500K. Still alternatively, upon application of external power to both the first light emitting region 21 and the second light emitting region 23, light realized by the light emitting diode may have a color temperature corresponding to a middle range between warm white and cool white. The structure of the second light emitting region 23 surrounding the first light emitting region 21 according to the illustrated exemplary embodiment allows efficient mixing of two colors.

The light spreading layer 50 mixes light components having different color temperatures therein. For example, in the light spreading layer 50, warm white light realized through combination of the first light emitting region 21 with the first wavelength conversion layer 31 may be mixed with cool white light realized through combination of the second light emitting region 23 with the second wavelength conversion layer 33. Here, the degree of color mixing may be adjusted depending upon the concentration of the light spreading layer 50. More particularly, the light spreading layer 50 having high concentration may provide a high degree of mixing of warm white light with cool white light, and the light spreading layer 50 having low concentration may provide a low degree of mixing of warm white light with cool white light.

A light emitting module 1000 according to an exemplary embodiment includes a first light emitting diode 200a and a second light emitting diode 200b. Here, each of the first light emitting diode 200a and the second light emitting diode 200b may include the light emitting diode shown in FIGS. 5A and 5B.

As such, the light emitting module 1000 may support a narrow beam angle and a wide beam angle as in the light emitting module 1000 described above in FIG. 1, and may allow control (variation) of the beam angle depending on application.

In addition, the light emitting module 1000 allows control of the color temperature. That is, as described above, the color temperature of light emitted from each of the first and second light emitting diodes 200a, 200b may be controlled through adjustment of the ratio of power applied to each of the first and second light emitting regions 21, 23. For example, the light emitting module 1000 may realize warm white light through the first light emitting diode 200a, and may realize cool white light through the second light emitting diode 200b, or vice versa.

Further, the light emitting module 1000 allows simultaneous control of the beam angle and the color temperature of light emitted from the first and second light emitting diodes 200a, 200b. For example, the beam angle of light emitted from the first light emitting diode 200a may be narrowed by increasing the ratio of power applied to the first light emitting region 21, and the first light emitting diode 200a may realize the narrow beam angle and a certain color temperature at the same time. Here, the color temperature of light emitted from the first light emitting diode 200a may be determined depending upon the type of first phosphor in the first wavelength conversion layer 31.

Alternatively, the beam angle of light emitted from the second light emitting diode 200b may be widened by increasing the ratio of power applied to the second light emitting region 23, and the second light emitting diode 200b may realize the wide beam angle and a certain color temperature at the same time. Here, the color temperature of light emitted from the second light emitting diode 200b may be determined depending upon the type of second phosphor in the second wavelength conversion layer 23.

Figure 6A:
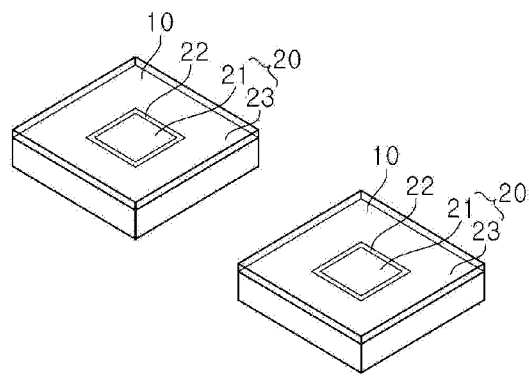
FIG. 6A, FIG. 6B, FIG. 6C, FIG. 6D, FIG. 6E, FIG. 6F, and FIG. 6G are schematic views illustrating a method of manufacturing a light emitting module according to an exemplary embodiment of the present invention.
Figure 6B:
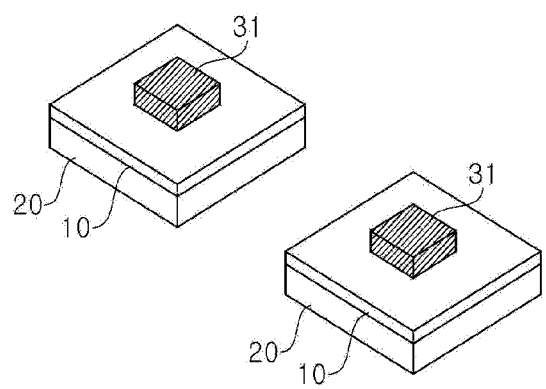
Figure 6C:
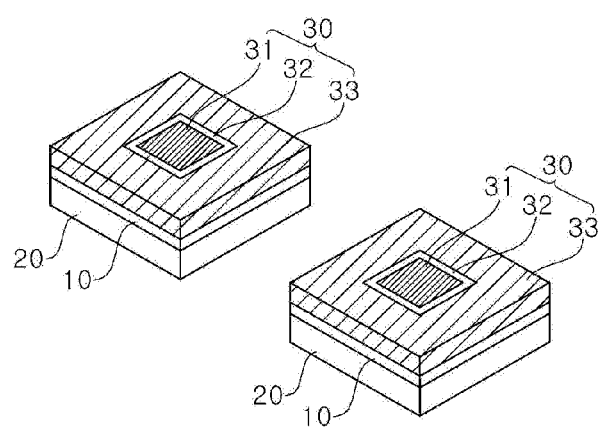
Figure 6D:
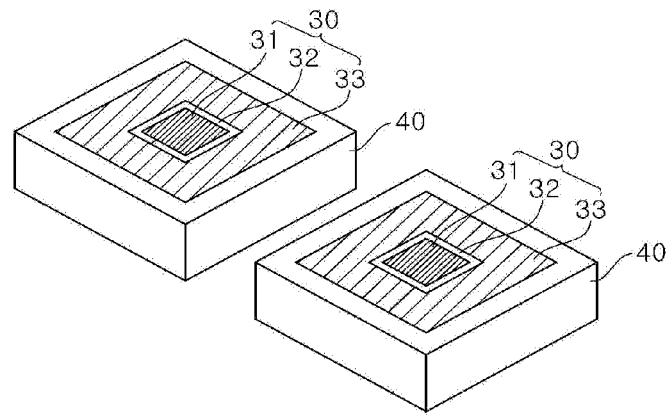
Figure 6E:
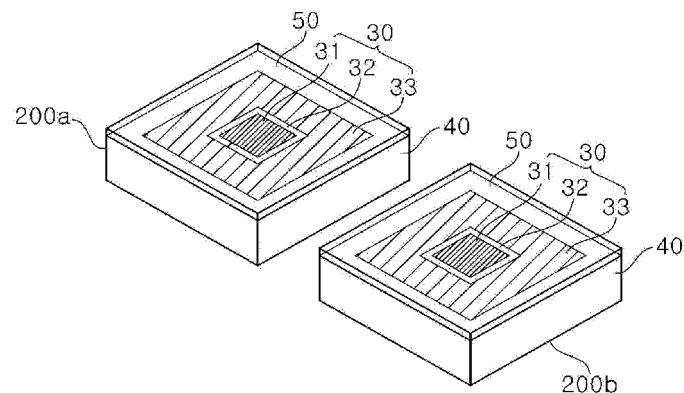
Figure 6F:
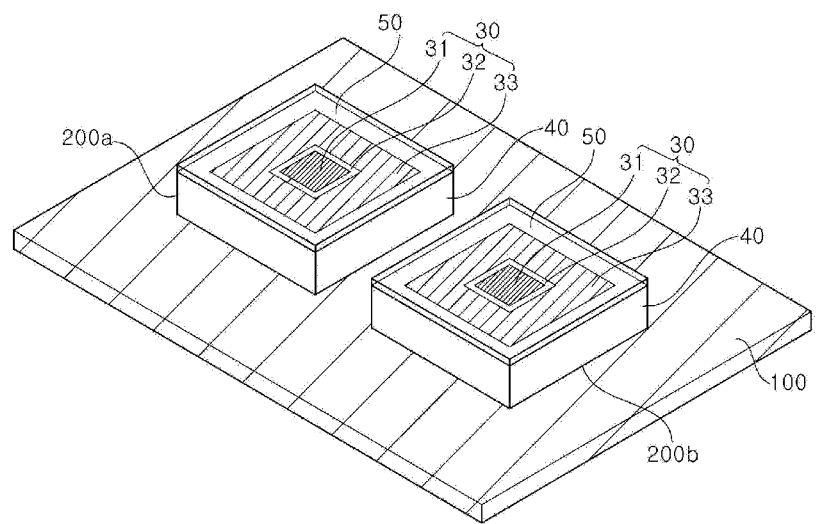
Figure 6G:
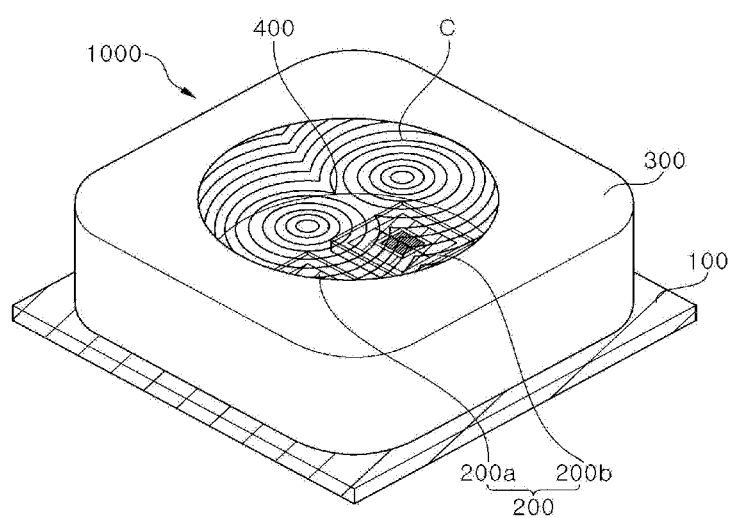

FIGS. 6A to 6G, 6B, and 6C shows a method of manufacturing a light emitting module according to an exemplary embodiment. More particularly, FIGS. 6A to 6E show a method of manufacturing a light emitting diode according to an exemplary embodiment, and FIGS. 6F to 6G show a method of manufacturing a light emitting module including the light emitting diode according to an exemplary embodiment.

Hereinafter, the light emitting diode included in the light emitting module will be described with reference to the light emitting diode shown in FIGS. 5A and 5B. A light emitting module including the light emitting diode shown in FIGS. 2A and 2B may also be manufactured by a similar method, except for a process of forming the wavelength conversion layer.

Referring to FIG. 6A, two light emitting diode chips each having a light emitting structure 20 on a substrate 10 are prepared. These light emitting diode chips may be manufactured together on the same substrate 10 or on different substrates. The light emitting structure 20 may include a plurality of light emitting regions. The light emitting structure 20 may include a first light emitting region 21 and a second light emitting region 23 surrounding the first light emitting region 21. The first light emitting region 21 and the second light emitting region 23 may be disposed on the substrate 10 to be spaced apart from each other. An isolation trench 22 may be formed between the first and second light emitting regions 21 and 23. The isolation trench 22 may expose a portion of a first conductivity type semiconductor layer through an upper surface of the light emitting structure 20, that is, through a second conductivity type semiconductor layer and an active layer of the light emitting structure 20. Alternatively, the isolation trench 22 may expose a portion of the substrate 10 through the second conductivity type semiconductor layer, the active layer, and the first conductivity type semiconductor layer of the light emitting structure 20.

The shapes of the first and second light emitting regions 21, 23 are not limited to the shapes shown in FIG. 6. In some exemplary embodiments, the shapes of the first and second light emitting regions 21, 23 may be modified in various ways as desired, so long as the first and second light emitting regions 21, 23 share the same center.

Referring to FIG. 6B, the first wavelength conversion layer 31 may be formed on the substrate 10 of each of the two light emitting diode chips. Here, the substrate 10 is a transparent substrate, and light emitted from the light emitting structure 20 is discharged through the substrate 10. In some exemplary embodiments, the substrate 10 may be disposed under the light emitting structure 20 and the first wavelength conversion layer 31 may be disposed on the light emitting structure 20. Alternatively, in some exemplary embodiments, the substrate 10 may be omitted.

The first wavelength conversion layer 31 may be disposed above the first light emitting region 21 of the light emitting structure 20, with the substrate 10 interposed therebetween. The first wavelength conversion layer 31 may include a phosphor to convert the wavelength of light emitted from the first light emitting region 21 therethrough. The first wavelength conversion layers 31 between the two light emitting diode chips may include the same or different phosphor combinations.

Referring to FIG. 6C, each of the two light emitting diode chips may include a second wavelength conversion layer 33 surrounding the first wavelength conversion layer 31. The second wavelength conversion layer 33 may correspond to the second light emitting region 23 of the light emitting structure 20. The second wavelength conversion layer 33 may include the same or different phosphor from the first wavelength conversion layer 31. In addition, the second wavelength conversion layers 33 between the two light emitting diode chips may include the same or different phosphor combinations.

In addition, a barrier layer 32 may be further formed between the first wavelength conversion layer 31 and the second wavelength conversion layer 33. The barrier layer 32 is formed to promote spreading of light, and may promote mixing of light emitted from the first wavelength conversion layer 31 and the second wavelength conversion layer 33 having different wavelengths.

The shape and area of the first wavelength conversion layer 31 may be the same or similar to those of the first light emitting region 21, and the shape and area of the second wavelength conversion layer 33 may be the same or similar to those of the second light emitting region 23.

The wavelength conversion layer 30 may be formed as a single sheet through screen printing, or the like. The wavelength conversion layer 30 may be directly formed on the light emitting structure 20, or may be independently manufactured to be attached to the light emitting structure 20.

When the wavelength conversion layer 30 includes the first and the second wavelength conversion layers 31, 33 having the same phosphor combination (or does not include the barrier layer), the processes of FIG. 6B and FIG. 6C may be integrated into a single process.

Referring to FIG. 6D, in each of the two light emitting diode chips, a lateral reflective layer 40 may be formed to cover a side surface of the light emitting structure 20. The lateral reflective layer 40 may cover not only the side surface of the light emitting structure 20, but also a side surface of the wavelength conversion layer 30 covering an upper surface of the light emitting structure 20. The lateral reflective layer 40 may include a white wall formed of a resin material. Alternatively, the lateral reflective layer 40 may include a metal reflective layer, such as an Al layer or an Ag layer, which has high reflectivity. The lateral reflective layer 40 blocks and reflects light emitted through the side surface of the light emitting structure 20, thereby restricting the beam angle of the light emitting diode.

Referring to FIG. 6E, in each of the two light emitting diode chips, a light spreading layer 50 may be formed to cover an upper surface of the wavelength conversion layer 30. The light spreading layer 50 may be formed to extend in a horizontal direction, so as to cover not only the upper surface of the wavelength conversion layer 30, but also an upper surface of the lateral reflective layer 40. The light spreading layer 50 mixes two light components having different color temperatures.

As a result, two light emitting diodes 200a, 200b may be manufactured through the processes of FIG. 6A to FIG. 6E.

Referring to FIG. 6F, a base substrate 100 is prepared to mount the first and second light emitting diodes 200a, 200b thereon. Here, the first and second light emitting diodes 200a, 200b may be separated a predetermined distance from each other.

The base substrate 100 may include an electrode pattern therein. The first and second light emitting diodes 200a, 200b mounted on the base substrate 100 may be connected to the electrode pattern to receive power applied from an external power source. In addition, the first and second light emitting diodes 200a, 200b may be individually driven to emit light having different beam angles and different color temperatures.

Referring to FIG. 6G, a housing 300 may be formed on the base substrate 100. In addition, a lens 400 may be formed on the light emitting diodes 200*a*, 200*b*. Here, the lens 400 may be secured to a sidewall of the housing 300.

The housing 300 may include a cavity C to define a region, in which the light emitting diodes 200*a*, 200*b* are mounted. The cavity C may be disposed at the center of the light emitting module 1000. The cavity C is surrounded by a sidewall. The sidewall may be formed to be perpendicular to the base substrate 100. In some exemplary embodiments, however, the sidewall may have an inclined facet to reflect light emitted from the light emitting diodes 200*a*, 200*b*. Further, the cavity C may have rotational symmetry, particularly a circular shape. As used herein, a rotational symmetry does not mean only a rotating body, but also encompasses a structure, in which the same shape is maintained when rotated at a certain angle, such as 60 degrees, 90 degrees, 130 degrees or 180 degrees. The cavity C may be formed to have various shapes as needed, without being limited to a circular shape.

The lens 400 may include two foci. The two foci may be placed on the first light emitting diode 200*a* and the second light emitting diode 200*b*, respectively. More particularly, an optical axis L1 of the first light emitting diode 200*a* and an optical axis L2 of the second light emitting diode 200*b* may be coincident with the two foci of the lens 400, respectively.

According to exemplary embodiments, a light emitting module includes a first light emitting diode and a second light emitting diode spaced apart from each other, in which each of the first and second light emitting diodes includes a first light emitting region and a second light emitting region surrounding the first light emitting region, in which each of the first and second light emitting regions is configured to be independently operated, thereby enabling control of a beam angle of light emitted therefrom. In addition, the light emitting module can emit light having different beam angles through the first and second light emitting diodes, and thus, can control the beam angle of light. Further, each of the light emitting diodes in the light emitting module may include a wavelength conversion layer, thereby enabling control of a color temperature of light emitted therefrom.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A light emitting module comprising:
    a base substrate;
    a first light emitting diode disposed on the base substrate; and
    a second light emitting diode disposed on the base substrate and spaced apart from the first light emitting diode,
    wherein each of the first light emitting diode and the second light emitting diode comprises a first light emitting cell and a second light emitting cell disposed on the same base substrate, the second light emitting cell being spaced apart from the first light emitting cell and surrounding the first light emitting cell, and
    wherein light from the light emitting module is configured to be emitted to the outside in a direction facing away from the base substrate.

2. The light emitting module according to claim 1, wherein each of the first and second light emitting diodes is configured to be independently operated.

3. The light emitting module according to claim 2, wherein the base substrate comprises an electrode pattern, and each of the first and second light emitting diodes is connected to the electrode pattern.

4. The light emitting module according to claim 2, wherein:
    each of the first and second light emitting cells comprises a first conductivity type semiconductor layer, an active layer, and a second conductivity type semiconductor layer; and
    the first and second light emitting cells regions are configured to be independently operated.

5. The light emitting module according to claim 4, wherein the first and second light emitting cells share the same center.

6. The light emitting module according to claim 4, wherein a beam angle of light emitted from each of the first and second light emitting diodes is configured to be controlled by a ratio of power applied to the first and second light emitting cells.

7. The light emitting module according to claim 6, wherein the beam angle of light emitted from the first light emitting diode is different from the beam angle of light emitted from the second light emitting diode.

8. The light emitting module according to claim 6, wherein the beam angle of light emitted from the first light emitting diode is the same as the beam angle of light emitted from the second light emitting diode.

9. The light emitting module according to claim 4, wherein each of the first and second light emitting diodes further comprises a wavelength conversion layer covering the first and second light emitting cells.

10. The light emitting module according to claim 9, wherein the wavelength conversion layer includes the same phosphor in the first and second light emitting cells.

11. The light emitting module according to claim 9, wherein the wavelength conversion layer comprises:
    a first wavelength conversion layer corresponding to the first light emitting cell and including a first phosphor; and
    a second wavelength conversion layer corresponding to the second light emitting cell and including a second phosphor.

12. The light emitting module according to claim 11, wherein the wavelength conversion layer further comprises a barrier layer interposed between the first wavelength conversion layer and the second wavelength conversion layer.

13. The light emitting module according to claim 11, wherein a color temperature of light emitted from each of the first and second light emitting diodes is configured to be controlled by ratio of power applied to the first and second light emitting cells.

14. The light emitting module according to claim 11, wherein a color temperature and a beam angle of light emitted from each of the first and second light emitting diodes are configured to be controlled by a ratio of power applied to the first and second light emitting cells.

15. The light emitting module according to claim 13, wherein the color temperature of light emitted from the first light emitting diode is different from that from the second light emitting diode.

16. The light emitting module according to claim 13, wherein the color temperature of the light emitted from the first light emitting diode is the same as that from the second light emitting diode.

17. The light emitting module according to claim 1, further comprising a lateral reflective layer covering a side surface of the second light emitting cell.

18. The light emitting module according to claim 1, further comprising a lens disposed on the first and second light emitting diodes.

19. The light emitting module according to claim 18, wherein the lens comprises two foci corresponding to optical axes of the first and second light emitting diodes, respectively.

20. The light emitting module according to claim 18, further comprising a housing disposed on the base substrate and comprising a cavity,
   wherein the first and second light emitting diodes are disposed in the cavity.

* * * * *